US009853166B2

(12) United States Patent
Cheng et al.

(10) Patent No.: US 9,853,166 B2
(45) Date of Patent: Dec. 26, 2017

(54) PERFECTLY SYMMETRIC GATE-ALL-AROUND FET ON SUSPENDED NANOWIRE

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 14/341,518

(22) Filed: Jul. 25, 2014

(65) Prior Publication Data

US 2016/0027929 A1    Jan. 28, 2016

(51) Int. Cl.
| | | |
|---|---|---|
| *H01L 29/76* | (2006.01) | |
| *H01L 29/786* | (2006.01) | |
| *H01L 29/10* | (2006.01) | |
| *H01L 29/06* | (2006.01) | |
| *H01L 29/66* | (2006.01) | |
| *H01L 29/423* | (2006.01) | |

(52) U.S. Cl.
CPC .... *H01L 29/78696* (2013.01); *H01L 29/0673* (2013.01); *H01L 29/1037* (2013.01); *H01L 29/42392* (2013.01); *H01L 29/66742* (2013.01)

(58) Field of Classification Search
USPC ......................................................... 257/347
See application file for complete search history.

(56) References Cited

U.S. PATENT DOCUMENTS

| 6,780,708 B1 * | 8/2004 | Kinoshita ............ H01L 27/105 |
| | | 257/E21.679 |
| 7,534,675 B2 | 5/2009 | Bangsaruntip et al. |
| 7,892,945 B2 | 2/2011 | Bedell et al. |
| 8,110,471 B2 | 2/2012 | Lee et al. |
| 8,384,065 B2 | 2/2013 | Bangsaruntip et al. |
| 8,551,833 B2 | 10/2013 | Chang et al. |
| 9,418,991 B2 * | 8/2016 | Liaw ................. H01L 21/76895 |
| 2008/0061379 A1 * | 3/2008 | Chen .................. H01L 29/6656 |
| | | 257/382 |

(Continued)

OTHER PUBLICATIONS

Final Rejection of U.S. Appl. No. 14/341,434 dated Oct. 4, 2016.*

(Continued)

*Primary Examiner* — Telly Green
(74) *Attorney, Agent, or Firm* — Tutunjian & Bitetto, P.C.; Louis J. Percello

(57) ABSTRACT

A semiconductor device including a plurality of suspended nanowires and a gate structure that is present on a channel region portion of the plurality of suspended nanowires. The gate structure includes a uniform length extending from an upper surface of the gate structure to the base of the gate structure. A dielectric spacer having a graded composition is present in direct contact with the gate structure. The dielectric spacer having a uniform length extending from an upper surface of the gate structure to the base of the gate structure. Source and drain regions are present on source and drain region portions of the plurality of suspended nanowires.

9 Claims, 9 Drawing Sheets

(56) References Cited

U.S. PATENT DOCUMENTS

| | | |
|---|---|---|
| 2008/0135949 A1 | 6/2008 | Lo et al. |
| 2013/0075797 A1 | 3/2013 | Okano |
| 2014/0264253 A1* | 9/2014 | Kim .................. H01L 29/0673 |
| | | 257/9 |
| 2015/0357327 A1* | 12/2015 | Liaw ................. H01L 21/76895 |
| | | 257/390 |

OTHER PUBLICATIONS

Non-Final Rejection of U.S. Appl. No. 14/341,434 dated Jan. 20, 2017.*

Dupre, C., et al., "15nm-diameter 3D Stacked Nanowires with Independent Gates Operation: ΦFET," IEEE International Electron Devices Meeting, IEDM, 2008. (4 Pages)

Hubert, A., et al., "A stacked SONOS technology, up to 4 levels and 6nm crystalline nanowires, with gate-all-around or independent gates (Φ-Flash), suitable for full 3D integration," IEEE International Electron Devices Meeting, IEDM, 2009. (4 Pages).

Zervas, M., et al. "Top-down fabrication of very-high density vertically stacked silicon nanowire arrays with low temperature budget," Microelectronic Engineering, vol. 88, Jun. 2011. (pp. 3127-3132).

* cited by examiner

PERFECTLY SYMMETRIC GATE-ALL-AROUND FET ON SUSPENDED NANOWIRE

BACKGROUND

Technical Field

The present disclosure relates to semiconductor devices, such as semiconductor devices including nanowires.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. Examples of such classes of devices include nanowire semiconductor devices.

SUMMARY

In one aspect, a semiconductor device is provided that includes a plurality of suspended nanowires and a gate structure that is present on a channel region portion of the plurality of suspended nanowires. The gate structure includes a uniform length extending from an upper surface of the gate structure to the base of the gate structure. A dielectric spacer having a graded composition is present in direct contact with the gate structure. The dielectric spacer having a uniform length extending from an upper surface of the gate structure to the base of the gate structure. Source and drain regions are present on source and drain region portions of the plurality of suspended nanowires.

In another aspect, a method of forming a semiconductor device is provided that includes forming a first replacement gate structure of light sensitive material on a channel region portion of the stack of suspended nanowires, and replacing the first replacement gate structure of the light sensitive material with a second replacement gate structure of a semiconductor gate material. A surface treatment process is then applied to at least sidewall surfaces of the second gate structure to convert a portion of the semiconductor gate material to a dielectric spacer on at least the sidewall surfaces of the second gate structure. The second replacement gate structure may then be replaced with a functional gate structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1A:
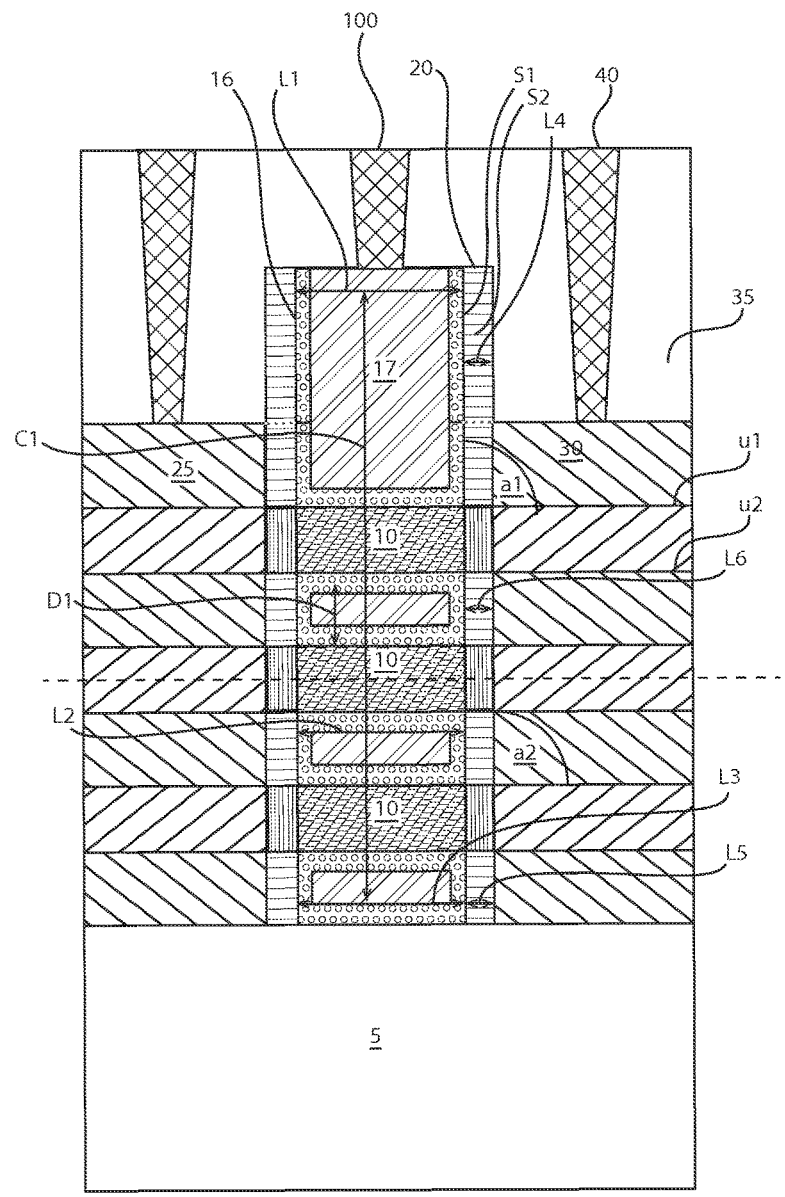
FIG. 1A is aside cross-sectional view depicting one embodiment of a semiconductor device including a plurality of nanowires and a symmetrical gate structure, wherein the gate structure and the gate sidewall spacer having a uniform length, and the gate sidewall spacer may have a graded composition, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region.

In some embodiments, the methods and structures disclosed herein provide a semiconductor device having a channel region that is provided by a suspended nanowire structure. As used herein, the term "nanowire" denotes a semiconductor containing structure having an arcular circumference. The diameter of a nanowire is typically less than 1 micron. By "suspended" it is meant that the channel region of the semiconductor device is present within a suspended nanowire that is separated from the underlying substrate surface. The gate structure for the semiconductor devices that are disclosed herein are typically present completely around an entire circumference of the portion of the suspended nanowire that provides the channel region of the device and is typically referred to as a gate all around (GAA) gate structure.

It has been determined when forming GAA gate structures on suspended nanowires using conventional replacement gate methods that produce a gate structure in which the gate length and the gate sidewall spacer length is non-symmetrical. This is especially the case when comparing the upper gate length, and upper sidewall spacer length to the lower gate length and the lower sidewall spacer length. For example, when forming GAA gate structures using a replacement metal gate (RMG) process, removal of dielectric materials, such as buried oxide (BOX), or sacrificial semiconductor materials, can result in the formation of a non-uniform source and drain extension region adjacent to the gate sidewall spacer. Further, when employing a gate first process, removal of the portion of the gate structure present underlying the suspended gate structure or under the gate sidewall spacer using etch processing introduces non-uniformity to the components of the gate structure and the gate sidewall spacer around the nanowire. Applicants have overcome the aforementioned difficulties and have provided a semiconductor device including suspended nanowires and a symmetrical gate structure/gate. sidewall spacer assembly, as will be discussed with more detail referring to FIGS. 1A-13.

Figure 1B:
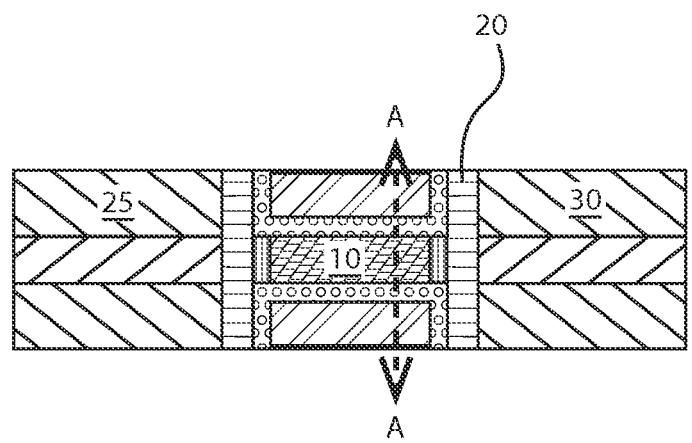
FIG. 1B is a top down view of the structure depicted in FIG. 1A.

FIGS. 1A and 1B depict one embodiment of a semiconductor device 100 that includes a plurality of suspended nanowires 10, in which a gate structure 15 is present on a channel region portion of the plurality of suspended nanowires 10.

The suspended nanowires 10 are typically composed of a semiconductor material, such as a silicon-containing material. The suspended nanowires 10 may be positioned over a substrate 5 that can be composed of a semiconductor material, such as silicon; a dielectric material, such as glass; or a metal material. Examples of silicon containing materials that are suitable for the suspended nanowires 10 include silicon, single crystal silicon, polysilicon, amorphous silicon, silicon germanium, silicon germanium doped with carbon, silicon doped with carbon and combinations thereof. The suspended nanowires 10 may also be composed of other semiconductor materials besides silicon. For example, the suspended nanowires 10 may be composed of germanium (Ge) or a III-V semiconductor material. III-V semiconductor materials that are suitable for the composition of the suspended nanowires 10 may include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof. It is noted that the above examples of semiconductor materials that are provided as examples for the composition of the suspended nanowires 10 is provided for illustrative purposes only, and are not intended to limit the present disclosure. For example, any semiconductor material that is suitable for the channel region of a semiconductor device is suitable for the composition of the suspended nanowires 10.

Although FIGS. 1A and 1B depict three nanowires 10, the plurality of nanowires may include any number for nanowires. For example, the number of nanowires present may range from 2 nanowires to 15 nanowires. In another example, the number of nanowires 10 present in the plurality of nanowires 10 may range from 3 nanowires to 6 nanowires. Each of the plurality of suspended nanowires 10 may have a substantially arcular cross section along section line A-A. By "substantially arcular" it is meant that the nanowire have a circular, oblong, or elliptical perimeter. In some examples, the suspended nanowires 10 have a circular cross section along section line A-A. The greatest dimension of cross section along sect on line A-A, e.g., the diameter of a circular cross section, may range from 2 nm to 25 nm. In another embodiment, the greatest dimension of cross section along section line A-A, e.g., the diameter of a circular cross section, may range from 4 nm to 10 nm. It is noted that the adjacent nanowires that are present in the plurality of nanowires may be separated by a dimension D1 ranging from 6 nm 30 nm. In another embodiment, the adjacent nanowires that are present in the plurality of nanowires 10 may be separated by a dimension D1 ranging from 7 nm to 10 nm.

The gate structure 15 (also referred to as the functional gate structure) is the structure used to control output current (i.e., flow of carriers in the channel) of a semiconducting device through electrical fields. The gate structure 15 includes at least one gate dielectric 16 and at least one gate conductor 17. The at least one gate dielectric 16 is typically present on a least the channel region of the semiconductor device. In the present case, the least one gate dielectric 16 is present on the channel region of the suspended nanowires, and in some embodiments is also present on an inner sidewall of the gate sidewall spacers 20 (also referred to as dielectric spacers).

The gate structure 15 is a gate all around (GAA) structure. FIG. 1A depicts one embodiment of the present disclosure in which a portion of each of the at least one gate dielectric 16 and the at least one gate conductor 17 is present both above and below the channel region for each of the suspended nanowires 10. FIG. 1B. depicts one embodiment of the present disclosure in which a portion of each of the at least one gate dielectric 16 and the at least one gate conductor 17 is present on opposing sides of the channel region portion for each of the suspended nanowires 10. In this embodiment, the width of the gate structure 15 is greater than the width, e.g., diameter, of the suspended nanowires 10. The width of the gate structure 15 is typically greater than the width of the at least one gate conductor 17.

The gate structure 15 has a uniform gate length extending from an upper surface of the gate structure 15 to the base of the gate structure 15. The gate length L1, L2, L3 is the dimension of the gate structure 15 measured from the end of the gate structure 15 that is in contact with the dielectric spacer 20 on the side of the gate structure 15 that is adjacent to the source region 25 of the device to the end of the gate structure 15 that is in contact with the dielectric spacer 20 on the side of the gate structure 15 that is adjacent to the drain region 30. By "uniform" it is meant that the first gate length L1 at the upper surface of the gate structure 15 is the substantially the same as the second gate length L2 at the lower surface of the gate structure 15. By "substantially the same" it is meant that the difference between the first gate length L1 at the upper surface of the gate structure 15 and the second gate length L2 at the lower surface of the gate structure 5 is +/10% of the greater dimension of the first or second gate length L1, L2.

In some embodiments, the difference between the first gate length L1 at the upper surface of the gate structure 15 and the second gate length L2 at the lower surface of the gate structure is 5% of the greater dimension of the first or second gate length L1, L2. In another embodiment, the difference between the first gate length L1 at the upper surface of the gate structure 15 and the second gate length L2 at the lower surface of the gate structure is 2% of the greater dimension of the first or second gate length L1, L2. In yet another embodiment, the difference between the first gate length L1 at the upper surface of the gate structure 15 and the second gate length L2 at the lower surface of the gate structure is 1% of the greater dimension of the first or second gate length L1, L2. In one example, there is no difference between the first gate length L1 at the upper surface of the gate structure 15 and the second gate length L2 at the lower surface of the gate structure 15. It is also noted that the uniformity in the gate length extends across the entire height of the gate structure. For example, the gate length L3 at the middle of the gate structure 15 is substantially the same as the gate length L1 at the upper surface of the gate structure 15, and the gate length L2 at the lower surface of the gate structure 15. In some examples, the gate length L1 L2, L3 may range from 5 nm to 20000 nm. In other examples, the gate length L1, L2, L3 may range from 10 nm to 30 nm. In one example, the uniform length of the gate structure denotes abuse dimension that is less than +/−1 nm different from an upper surface dimension.

The at least one gate dielectric 16 can be comprised of a semiconductor oxide, semiconductor nitride, semiconductor oxynitride, or any multilayered stack thereof. In one example, the at least one gate dielectric 16 can be comprised of a semiconductor oxide such as, for example, silicon dioxide. The at least one gate dielectric 16 can also be comprised of a dielectric metal oxide having a dielectric constant that is greater than the dielectric constant of silicon dioxide, e.g., 3.9. The dielectric constants that are described herein are measured at room temperature, i.e., 25° C., at atmospheric pressure, i.e., 1 atm. In one embodiment, the at least one gate 16 can comprise a dielectric oxide having a dielectric constant greater than 4.0. In another embodiment, the at least one gate dielectric 16 can be comprised of a dielectric oxide having a dielectric constant of greater than 8.0. Exemplary dielectric oxide materials which have a dielectric constant of greater than 3.9 include, hut are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed as the at least one gate dielectric 16. For example, the at least one gate dielectric 16 can include a stack of from bottom to top, silicon dioxide and hafnium oxide.

The at least one gate conductor 17 may be composed of conductive materials including, but not limited to metals, metal loys, metal nitrides and metal silicides, as well as laminates thereof and composites thereof. In one embodiment, the gate conductor 12 may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The at least one gate conductor 17 may also comprise doped polysilicon and/or polysilicon-germanium alloy materials (i.e., having a dopant concentration from $1 \times 10^{18}$ dopant atoms per cubic centimeter to $1 \times 10^{22}$ dopant atoms per cubic centimeter) and polycide materials (doped polysilicon/metal silicide stack materials).

In some embodiments, the at least one gate conductor 17 may be composed of p-type work function metal. As used herein, a "p-type work function metal" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mn, Co and alloys and combinations thereof.

In some embodiments, the at least one gate conductor 17 may be composed of a p-type work function metal. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

In some embodiments, the symmetry of the gate structure 15 provides that the sidewall S1 of the gate structure 15 intersects with the upper surface U1 and lower surface U2 of the suspended nanowires 10 at a substantially perpendicular angle α1 on both the source region side of the gate structure 15 and the drain region side of the gate structure 15. For example, the substantially perpendicular angle α1 defined at the intersection of the upper surface U1 of the suspended nanowires 10 and the sidewall S1 of the gate structure 15 is 90° plus/minus 10°. In another example, the substantially perpendicular angle α1 defined at the intersection of the upper surface U1 of the suspended nanowires 10 and the sidewall S1 of the gate structure 15 is 90° plus/minus 5°. In yet another example, the substantially perpendicular angle α1 defined at the intersection of the upper surface U1 of the suspended nanowires 10 and the sidewall S1 of the gate structure 15 is 90°

A dielectric spacer 20 (also referred to as a gate sidewall spacer) may be formed on the sidewall of the gate structure 15. Similar to the gate structure 15, the dielectric spacer 20 has a uniform length extending from an upper surface of the gate structure 15 to the base of the gate structure 15. The length L4, L5, L6 of the dielectric spacer 20 is a dimension extending from an outermost sidewall of the dielectric spacer 20 to an innermost sidewall of the dielectric spacer 20 on either the source region side or drain region side of the gate structure 15. The plane for the length of the dielectric spacer 20 is parallel with the plane for the length of the gate structure 15. The term "uniform" as used to describe the length of the dielectric spacer 20 denotes that a first spacer length L4 at the upper surface of the dielectric spacer 20 is substantially the same as second spacer length L5 at the lower surface of the dielectric spacer 20. By "substantially the same" as used to describe the length of the dielectric spacer 20 along the dielectric spacer's height it is meant that the difference between the first spacer length L4 at the upper surface of the dielectric spacer 20 and the second gate length L5 at the lower surface of the dielectric spacer 20 is +/10% of the greater dimension of the first or second spacer length L4, L5.

In some embodiments, the difference between the first spacer length L4 at the upper surface of the dielectric spacer 20 and the second spacer length L5 at the lower surface of the dielectric spacer 20 is 5% of the greater dimension of the first or second spacer length L4, L5. In another embodiment, the difference between the first spacer length L4 at the upper surface of the dielectric spacer 20 and the second spacer length L5 at the lower surface of the dielectric spacer 20 is 2% of the greater dimension of the first or second dielectric length L4, L5. In yet another embodiment, the difference between the first spacer length L4 at the upper surface of the dielectric spacer 20 and the second spacer length L5 at the lower surface of the dielectric spacer 20 is 1% of the greater dimension of the first or second spacer length L4, L5. It is also noted that the uniformity in the spacer length extends across the entire height of the dielectric spacer 20. For example, the spacer length L6 at the middle of the dielectric spacer 20 is substantially the same as the spacer length L4 at the upper surface of the dielectric spacer 20, and the spacer length L5 at the lower surface of the dielectric spacer 20. In some examples, the spacer length L4, L5, L6 may range from 2 nm to 30 nm. In other examples, the spacer length L4, L5, L6 may range from 5 nm to 20 nm. In some embodiments, the inner and outer sidewall S2, S3 of the dielectric spacer 20 are planar, i.e., do not include a substantial curvature.

Similar to the sidewall S1 of the gate structure 15, the symmetry of the dielectric spacer 20 provides that the sidewall S2 of the dielectric spacer 20 intersects with the upper surface U1 and lower surface U2 of the suspended nanowires 10 at a substantially perpendicular angle α2 on both the source region side of the gate structure 15 and the drain region side of the gate structure 15. For example, the substantially perpendicular angle α2 defined at the intersection of the upper surface U1 of the suspended nanowires 10 and the sidewall S2 of the sidewall S2 of the dielectric spacer 20 is 90° plus/minus 10°. In another example, the substantially perpendicular angle α2 defined at the intersection of the upper surface U1 of the suspended nanowires 10 and the sidewall S2 of the sidewall spacer 20 is 90° plus/minus 5°. In yet another example, the substantially perpendicular angle α2 defined at the intersection of the upper surface U1 of the suspended nanowires 10 and the sidewall S2 of the sidewall spacer 20 is 90°.

In some embodiments, the dielectric spacer 20 has a graded composition. The term "graded composition" as used to describe the dielectric spacer 20 means that the composition of the dielectric spacer 20 includes a semiconductor element and a dielectric element, wherein the wt. % of the dielectric element component of the composition decreases from the exterior surface of the dielectric spacer 20 in a direction towards the center C1 of the gate structure that the dielectric spacer 20 is abutting. The dielectric spacer 20 may be composed of any dielectric material including a semiconductor element, such as silicon. For example, the dielectric spacer 20 may composed of silicon nitride ($SiN_4$), silicon oxide ($SiO_2$), oxynitride (SiON), silicon germanium oxide, germanium oxide, germanium nitride, germanium oxygen nitride and combinations thereof. In one example, the graded composition of the dielectric spacer 20 is defined by a decreasing oxygen or nitrogen concentration in a direction extending from the exterior surface of the dielectric spacer 20 in a direction towards the center C1 of the gate structure that the dielectric spacer 20 is abutting. In some examples, when the dielectric spacer is composed of a silicon and oxygen containing material, the grading of the oxygen atoms in the dielectric spacer 20 provides that within a 10 nm distance, the composition of the spacer gradually changes from $SiO_2$ to SiO in a direction towards a center of the gate structure. In some examples, when the dielectric spacer is composed of a silicon and nitrogen containing material, the grading of the nitrogen atoms in the dielectric spacer 20 provides that within a 10 nm distance, the composition of the dielectric spacer is graded to gradually change from a silicon to nitrogen ratio of 1:1 to a silicon to nitrogen ratio of 3:4 in a direction towards a center of the gate structure. The grading of the composition of the dielectric spacer 20 may be provided by the surface treatment, such as nitridation, ion implantation of a dielectric species, annealing in an oxidizing atmosphere, plasma treatment or a combination thereof, which is applied to a semiconductor replacement gate structure to form the dielectric spacer 20. In some embodiments, the grading in the composition of the dielectric spacer 20 may be detected using electron energy loss spectroscopy (EELS).

Still referring to FIGS. 1A and 1B, a source region 25 and a drain region 30 are present on opposing sides of the gate structure 15. The source region 25 and drain region 30 are typically composed of an epitaxially formed semiconductor material, and are typically doped to have a conductivity type that dictates the conductivity type of the device. As used herein, the term "conductivity type" denotes a dopant region being p-type or n-type. As used herein, "p-type" refers to the addition of impurities to an intrinsic semiconductor that creates deficiencies of valence electrons. In a type IV semiconductor, e.g., a silicon-containing material, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing material, type IV semiconductor, examples of n-type dopants, i.e., impurities, include but are not limited to antimony, arsenic and phosphorous. In some embodiments, when the source and drain regions 25, 30 are doped to a p-type conductivity, the semiconductor device 100 including the suspended nanowires 10 is a p-type semiconductor device. In some embodiments, when the source and drain regions 25, 30 are doped to an n-type conductivity, the semiconductor device 100 including the suspended nanowires 10 is an n-type semiconductor device.

The epitaxial semiconductor material of the source region 25 and the drain region 30 may be formed on the portions of the suspended nanowires 10 that extend beyond the overlying dielectric spacer 20. These portions of the suspended nanowires 10 that extend beyond the overlying dielectric spacer 20 may be referred to as the source and drain portions of the suspended nanowires 10. Referring to FIG. 1A, the epitaxial semiconductor material of the source region 25 and the drain region 30 may be present atop the upper surface U1 of the source and drain region portions of the suspended nanowires 10, as well as the underlying surface U2 of the source and drain region portions of the suspended nanowires 10. The epitaxial semiconductor material may fill the space between adjacent suspended nanowires 10. Referring to FIG. 1B, the epitaxial semiconductor material of the source region 25 and the drain region 30 may also be present along the sidewall of the suspended nanowires 10 so that the epitaxial material is present all around the source and drain region portions of the suspended nanowires 10 similar to how the gate structure 15 is a gate all around (GAA) structure that is present around the channel region of the suspended nanowire 10. In some embodiments, the semiconductor material that provides the epitaxial semiconductor material of the source and drain regions 25, 30 may be a silicon including or germanium including material, such as silicon, silicon doped with carbon (Si:C), germanium, silicon germanium (SiGe), germanium doped with carbon (SiGe:C) and combinations thereof. In other embodiments, the epitaxial semiconductor material of the source and drain regions 25, 30 may be composed of a III-V semiconductor material. The above description of III-V semiconductor materials that is suitable for the suspended nanowires 10 is suitable for a description of a III-V semiconductor material for the epitaxial semiconductor material for the source and drain regions 25, 30.

In some embodiments, the semiconductor device 100 may further include an interlevel dielectric material 35 that is present overlying the semiconductor device. Contacts 45 of an electrically conductive material, such as a metal or metal semiconductor alloy, e.g., silicide, may formed through the interlevel dielectric layer to the gate structure 15, the source region 25 and the drain region 30. The semiconductor device depicted in FIGS. 1A and 1B is now described in further detail with reference to FIGS. 2-13.

Figure 2:
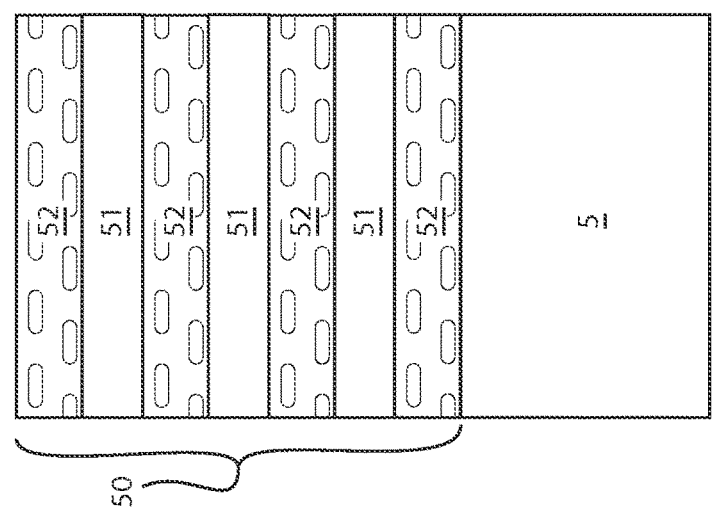
FIG. 2 is aside cross-sectional view depicting a material stack that includes a sequence of semiconductor material layers and sacrificial material layers that are present on a substrate, wherein the semiconductor material layers are for forming suspended nanowires, in accordance with one embodiment of the present disclosure.

FIGS. 2-13 depict one embodiment of a method of forming as semiconductor device including suspended nanowires 10 for the channel region of the device and a gate all around (GAA) gate structure 15. FIG. 2 depicts one embodiment of a material stack 50 that includes a sequence of semiconductor material layers 51 and sacrificial material layers 52 that are present on a substrate 5, in which the semiconductor material layers 51 are for forming the suspended nanowires 10. By "sacrificial" it is meant that the structure is present during processing of the semiconductor device, but is removed from the semiconductor device prior to the device being completed.

The above description of the composition for the suspended nanowires 10 is suitable for the description of the semiconductor material layers 51. The composition of the sacrificial material layers 52 is selected so that the sacrificial material layers 52 may be removed by an etch that is selective to the semiconductor material layers 51. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, in one embodiment of the present disclosure in which the sacrificial material layers 52 are composed of a germanium containing material, such as silicon germanium, and the semiconductor material layers 51 are composed of a silicon containing material, such as silicon, the etch process may remove the germanium containing material of the sacrificial material layers 52 selectively to the silicon containing material of the semiconductor material layers 51. It is noted that the sacrificial material layer 52 is not limited to semiconductor materials, such as germanium containing materials, e.g., germanium or silicon germanium, because the sacrificial material layer 52 may be composed of any material that can be removed selectively to the semiconductor material layers 51. For example, the sacrificial material layers 52 may be composed of a dielectric material, such as a nitride, e.g., silicon nitride ($Si_3N_4$), oxide, e.g., silicon oxide ($SiO_2$), or oxynitride material.

The material stack 50 of the sacrificial material layer 52 and the semiconductor material layer 51 may be formed on the substrate 5 using a deposition process, such as, e.g., chemical vapor deposition (CVD), plasma enhanced chemical vapor deposition (PECVD), high density plasma chemical vapor deposition (HDPCVD), metal organic chemical vapor deposition (MOCVD), dip coating, spin-coating, brush coating, sputtering, chemical solution deposition, and/or physical vapor deposition. The thickness of the semiconductor material layer 51 is selected to provide a circumference for the later formed suspended nanowires 10, and the thickness of the sacrificial material layer 52 is provided to provide the distance between adjacent suspended nanowires.

Figure 3:
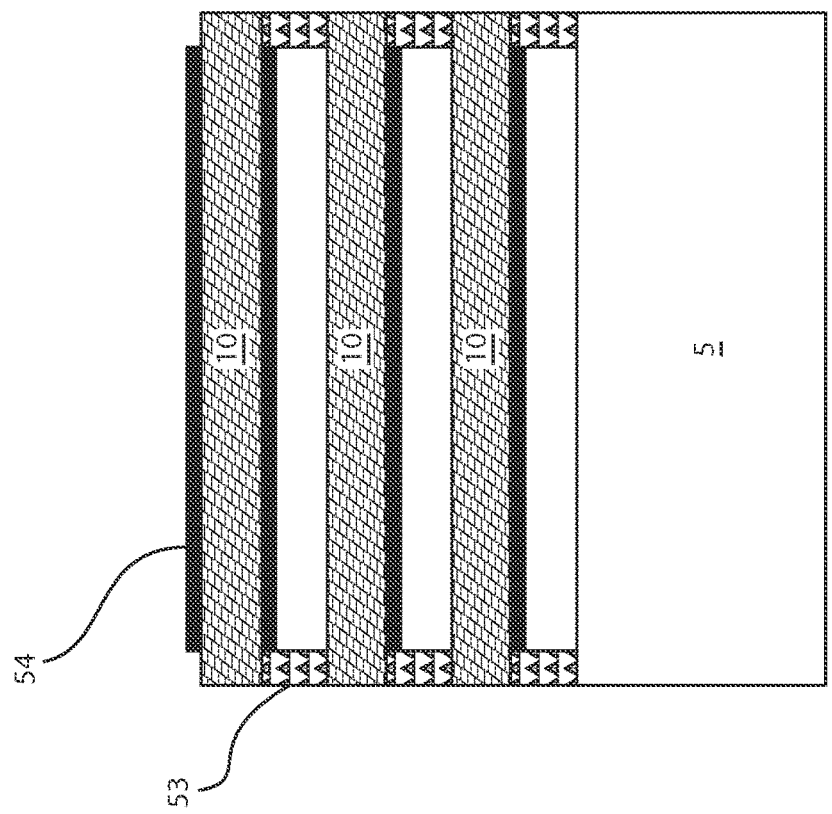
FIG. 3 is a side cross-sectional view depicting forming a stack of suspended nanowires from the material stack including the sequence of semiconductor material layers and sacrificial material layers, in accordance with one embodiment of the present disclosure.

FIG. 3 depicts one embodiment of forming a stack of suspended nanowires 10 from the material stack 50 depicted in FIG. 2 that includes the sequence of the semiconductor material layers 51 and the sacrificial material layers 52. Forming the suspended nanowires 10 may begin with forming an etch mask (not shown) on the material stack 50. The etch mask typically protects the portion of the material stack 50 including the portions of the semiconductor material layers 51 that will provide the suspended nanowires 10, and the portions of the sacrificial material layer 52 that are present between the portions of the adjacent semiconductor material layers 51 that will provide the suspended nanowires. In some embodiment, the etch mask may be composed of a photoresist material that has been patterned and developed using photolithography methods.

Following formation of the etch mask, the suspended nanowires 10 are defined using an etch process. In a first stage of an etch process, the material stack 50 may be etched by an anisotropic etch, such as reactive ion etch (RIE), to form a stacked structure of sacrificial material layers 52, and semiconductor material layers 51 having a perimeter with a geometry substantially equal to the geometry of the suspended nanowires 10 being formed. At this stage of the etch process, the etch process may remove the material of the sacrificial material layers 52 and the semiconductor material layers 51 selectively to the semiconductor substrate 10.

In a second stage of the etch process, the remaining portion of the sacrificial material layer 52 that is present between the etched portions of the semiconductor material layers 51 that provide the nanowires 10 may be removed by an isotropic etch, such as a plasma etch or wet chemical etch, that is selective to the substrate 5 and the semiconductor material layer 51. Following the second stage of the etch process for etching the sacrificial semiconductor material layers 52, the remaining portions of the sacrificial material layer 52 that are present at the ends of the suspended nanowires 10 provide the anchors 53 which support the suspended nanowires 10.

Following the etch process that removes the majority of the sacrificial material layer 52 and defines the anchors 53, the multi-sided cross section, e.g., square or rectangular cross section, of the remaining portion of the semiconductor material layers 51 may be smoothed using a hydrogen anneal to form elliptical shaped or cylindrical shaped suspended nanowires 10, wherein in some embodiments the suspended nanowires include a circular geometry cross-section or oblong geometry cross-section. In some embodiments, the hydrogen anneal that is employed in the present disclosure can be performed at a temperature from 600° C. to 1000° C. The pressure of hydrogen used during the hydrogen anneal can range from 5 torr to 600 torr. It is noted that the above described parameters for the hydrogen anneal are provided for illustrative purposes only, and are not intended to limit the present disclosure.

Still referring to FIG. 3, the suspended nanowires 10 may be coated with a passivating layer 54, which may also be referred to as a dielectric coating or protective coating. In some embodiments, the passivating layer 54 may be composed of a dielectric material, such as an oxide, e.g., hafnium oxide or silicon oxide. In other embodiments, the passivating layer 54 may be a nitrogen including dielectric, such as silicon nitride, silicon oxynitride or hafnium oxynitride. The passivating layer 54 may be deposited using a chemical vapor deposition method, such as plasma enhanced chemical vapor deposition (PECVD), and may be formed around an entirety of the circumference of the exposed portions of the suspended nanowires 10. The thickness of the passivating layer 54 may range from 0.5 nm to 10 nm. In one example, the passivating layer 54 may have a thickness ranging from 1 nm to 2 nm.

Figure 4:
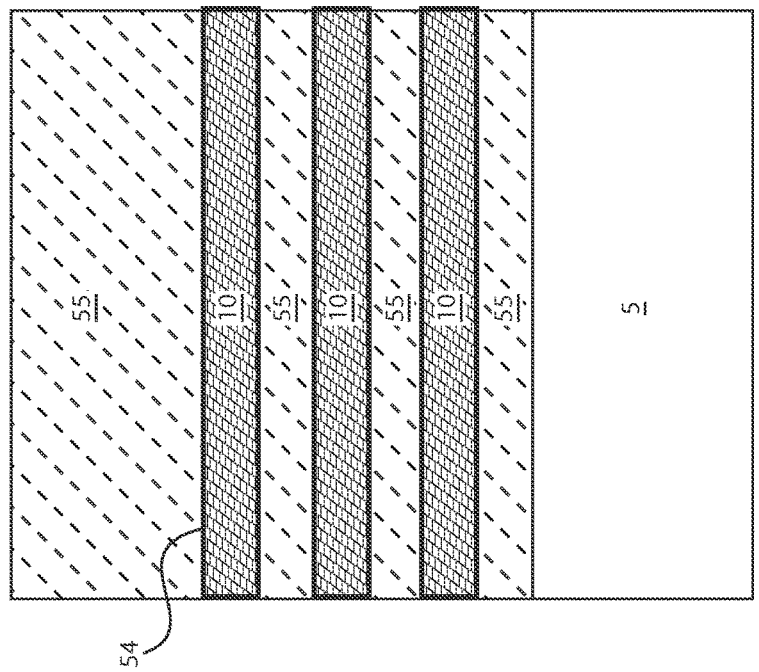
FIG. 4 is a side cross-sectional view depicting forming alight sensitive material on the stack of suspended nanowires, wherein the light sensitive material fills the openings between adjacent nanowires, in accordance with the present disclosure.

FIG. 4 depicts one embodiment of forming a light sensitive material 55 on the stack of suspended nanowires 10, wherein the light sensitive material 55 fills the openings between adjacent nanowires 10. The light sensitive material 55 is typically a photoresist material, such as a positive or negative resist material. A positive resist s a type of photoresist in which the portion of the photoresist that is exposed to light becomes soluble to photoresist developer, and the portion of the photoresist that is not exposed to light is insoluble; and a negative resist is a type of photoresist in which the portion of the photoresist that is exposed to light becomes insoluble to the photoresist developer, and the unexposed portion of the photoresist is dissolved by the photoresist developer. In some embodiments, the light sensitive material 55 is comprised of a photoresist material selected from the group consisting of Hydrogen silsesquioxane (HSQ), Poly(methyl methacrylate) (PMMA), Poly (methyl glutarimide) (PMGI), Phenol formaldehyde resin (DNQ/Novolac), SU-8 and combinations thereof. The light sensitive material 55 is deposited using a deposition method, such as spin-on-deposition, solution deposition, curtain deposition, laminating and combinations thereof. The thickness of the light sensitive material 55 being deposited on the suspended nanowires 10 is selected to fill the space between the anchors 53 of adjacent suspended nanowires 10.

Figure 5:
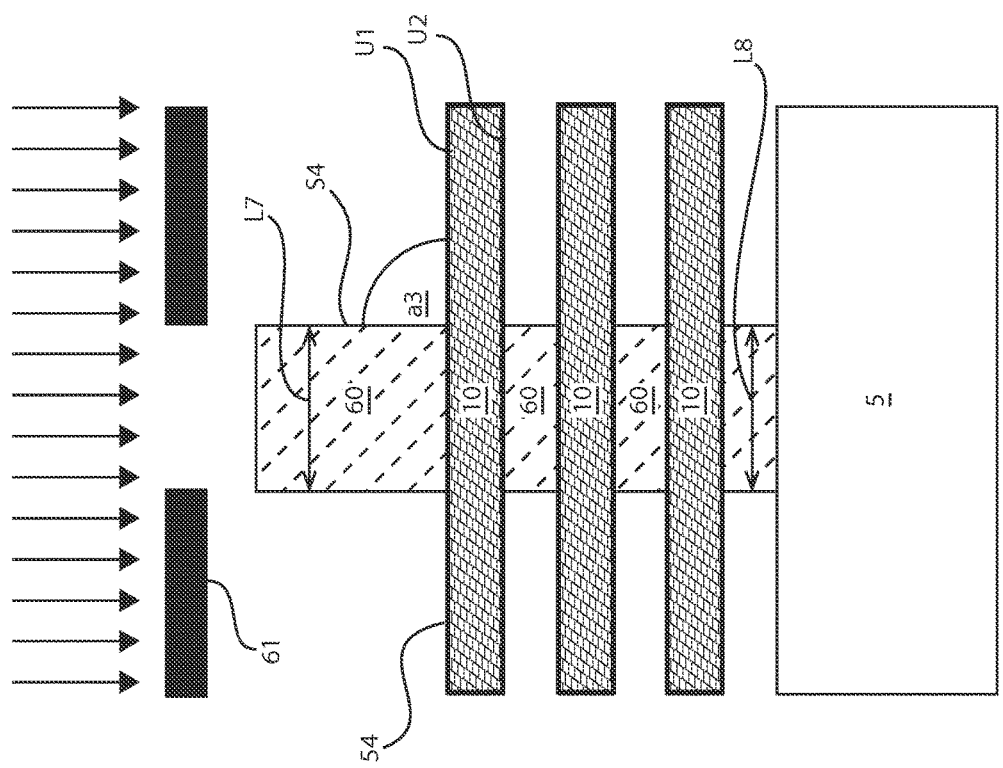
FIG. 5 is a side cross-sectional view depicting patterning the light sensitive material to provide a first replacement gate structure of a light sensitive material on a channel region portion of the stack of suspended nanowires, in accordance with one embodiment of the present disclosure.

FIG. 5 depicts one embodiment of patterning the light sensitive material 55 to provide a first replacement gate structure 60 of a light sensitive material 55 on a channel region portion of the stack of suspended nanowires 10. The term "replacement gate structure" as used herein denotes a gate structure that is used to determine the geometry of the final functional gate structure during the process sequence for forming the semiconductor device, but the replacement gate structure is not present in the fin device structure. The light sensitive material 55 may be patterned by exposure of the light sensitive material through a mask 61, wherein in some embodiments the light type for exposure may include UV, DUV, and the g and I lines having wavelength of 436 nm and 365 nm. Exposure may also be provided by electron beam exposure. Although FIG. 5 depicts that the light sensitive material 55 is being patterned is a positive resist, light sensitive material 55 of a negative resist composition is also suitable for use with the present disclosure.

Following exposure, the light sensitive material 55 is developed using a chemical developer, where the unexposed portions of the tight sensitive material 55 is dissolved by the developer and the exposed portion of the light sensitive material 55 remains to provide the first replacement gate structure 60. The first replacement gate structure 60 is formed by chemical development of the exposed light sensitive material, which does not include etch processing. Chemical development may include development by dissolution in a basic solution, which can include tetramethylammonium hydroxide (TMAH) in water.

In some embodiments, because the first replacement gate structure 60 is formed using photolithography and development steps without employing etch processing, the first replacement gate structure 60 is highly symmetrical. The high symmetry of the first replacement gate structure 60 is one factor that dictates the high symmetry of the final, functional gate structure 15 in the operative semiconductor device formed by the present method. For example, similar in the final/function gate structure 15, the first replacement gate structure 60 has a uniform gate length extending from an upper surface of the first replacement gate structure 60 to the base of the first replacement gate structure 60. By "uniform" it is meant that the first replacement gate length L7 at the upper surface of the first replacement gate structure 60 is the substantially the same as second replacement gate length L8 at the lower surface of the replacement gate structure 60. By "substantially the same" it is meant that the difference between the first replacement gate length L7 at the upper surface of the gate replacement structure 60 and the second replacement gate length L8 at the lower surface of the replacement gate structure 60 is +/10% of the greater dimension of the first or second replacement gate length L7, L8. The dimensions of the replacement gate structure 60 are comparable to the dimensions of the functional gate structure 15.

In some embodiments, the symmetry of the first replacement gate structure 60 provides that the sidewall S4 of the first replacement gate structure 60 intersects with the upper surface U1 and lower surface U2 of the suspended nanowires 10 at a substantially perpendicular angle α3 on both the source region side of the first replacement gate structure 60 and the drain region side of the first replacement gate structure 60. The angle α3 of intersection between the sidewall S4 of the first replacement gate structure 60 and the upper surface U1 or lower surface U2 of the suspended nanowires 10 is similar to the angle α1 of intersection between the sidewall S1 of the functional gate structure 15 and the upper surface U1 or lower surface U2 of the suspended nanowires 10. Therefore, the description of the angle α1 of intersection between the sidewall S1 of the functional gate structure 15 and the upper surface U1 or lower surface U2 of the suspended nanowires 10 is suitable for the description of the angle α3 of intersection between the sidewall S3 of the first replacement gate structure 60 and the upper surface U1 or lower surface U2 of the suspended nanowires 10.

Figure 6:
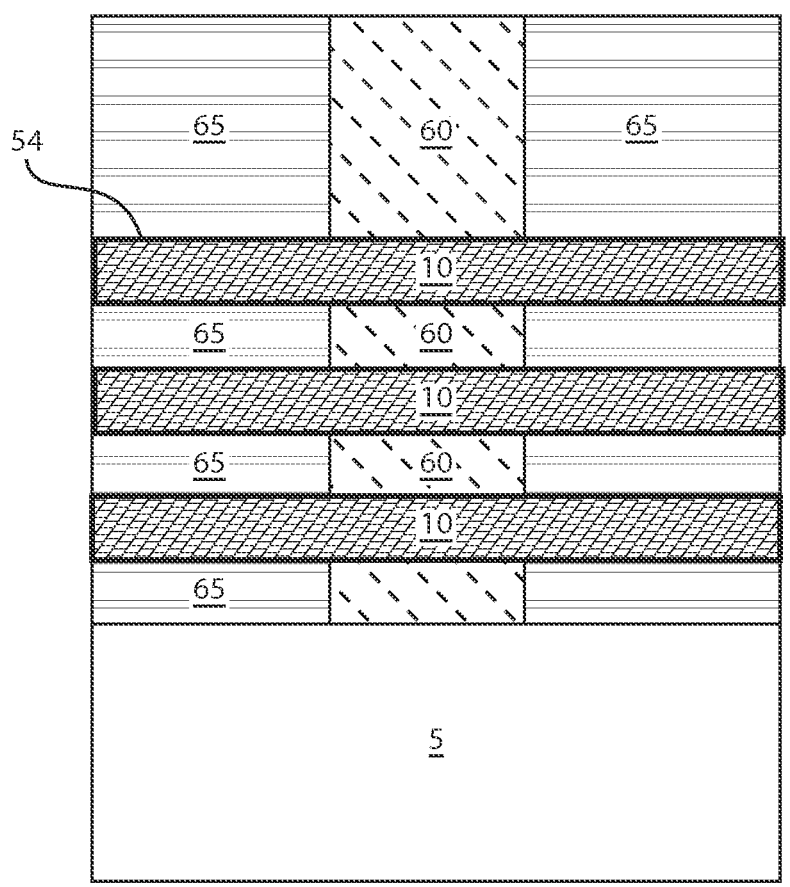
FIG. 6 is aside cross-sectional view depicting one embodiment of forming a semiconductor source and drain replacement material on exposed portions of the stack of suspended nanowires, in accordance with the present disclosure.

FIG. 6 depicts one embodiment of forming a semiconductor source and drain replacement material 65 on the exposed portions of the stack of suspended nanowires 10. The semiconductor source and drain replacement material 65 fills the space between adjacent suspended nanowires 10. The semiconductor source and drain replacement material 65 may be deposited using chemical vapor deposition (CVD). Examples of CVD processes suitable for forming the semiconductor source and drain replacement material 65 may include, but is not limited to, plasma enhanced chemical vapor deposition (PECVD), high density plasma chemical vapor deposition (HDPCVD), atomic layer deposition (ALD) and combinations thereof. The semiconductor source and drain replacement material 65 may also be formed using chemical solution deposition, spin on deposition, and physical vapor deposition (PVD) processes. Following deposition, the semiconductor source and drain replacement material 65 may be planarized, e.g., planarized by chemical mechanical planarization, so that an upper surface of the semiconductor source and drain replacement material 65 is coplanar with an upper surface of the first replacement gate structure 60 of the light sensitive material.

Figure 7:
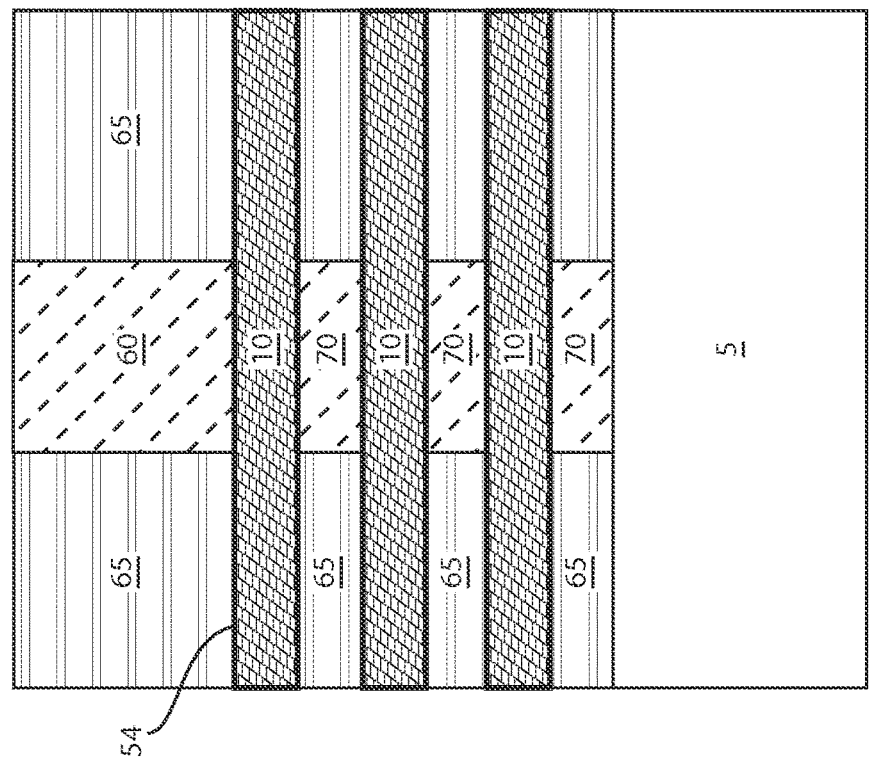
FIG. 7 is a side cross-sectional view depicting removing the first replacement gate structure to provide a gate opening to the channel region portion of the stack of suspended nanowires, and forming a second replacement gate structure of a semiconductor gate material in the opening to the channel region portion of the stack of suspended nanowires, in accordance with one embodiment of the present disclosure.

FIG. 7 depicts one embodiment of removing the first replacement gate structure 60 to provide a gate opening to the channel region portion of the stack of suspended nanowires 10, and forming a second replacement gate structure 70 of a semiconductor gate material in the opening to the channel region portion of the stack of suspended nanowires 10. In one embodiment, the first replacement gate structure 60 may be removed by an etch that is selective to the suspended nanowires 10, and the semiconductor source and drain region replacement material 65. The etch process for removing the first replacement gate structure 60 may including at least one of anisotropic etching and isotropic etching.

Figure 8:
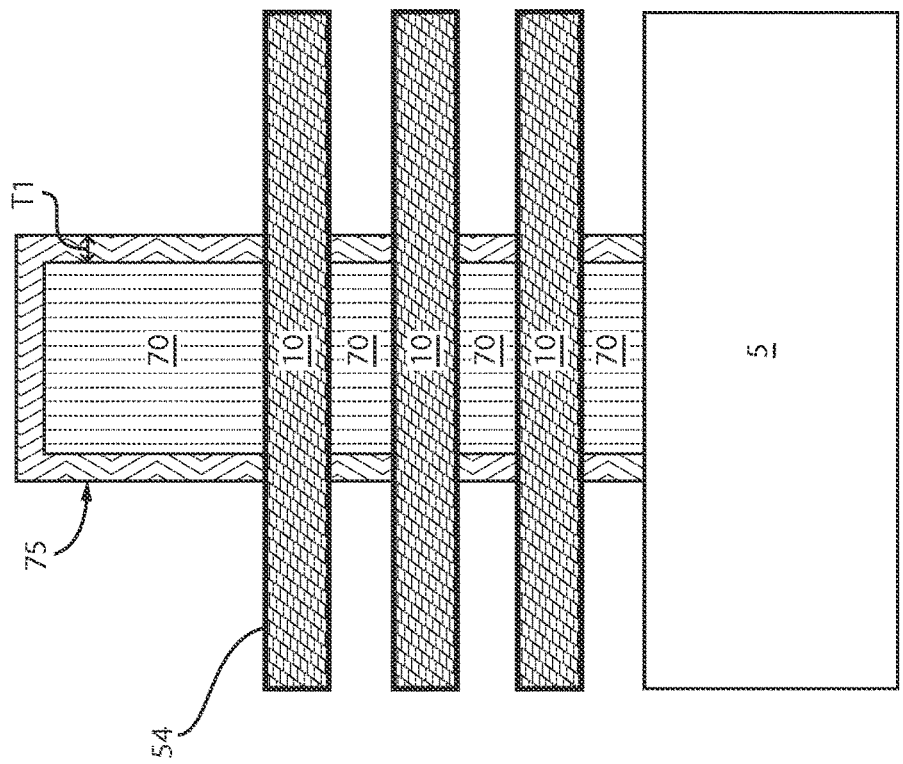
FIG. 8 is a side cross-sectional view depicting removing the semiconductor source and drain replacement material, and applying a surface treatment process is to at least the sidewall surfaces of the second replacement gate structure to convert a portion of the semiconductor gate material to a dielectric spacer material, in accordance with one embodiment of the present disclosure.

FIG. 8 depicts one embodiment of forming a second replacement gate structure 70 of a semiconductor gate material in the gate opening to the channel region portion of the stack of suspended nanowires 10. The semiconductor gate material of the second replacement gate structure 70 is selected so that a later applied surface treatment, such as nitridation, implantation of a dielectric species, annealing in an oxidizing environment, or plasma treatment, forms a dielectric spacer 20 on the exterior surfaces of the second replacement gate structure 70.

In one example, the semiconductor gate material of the second replacement gate structure 70 may be composed of polysilicon, such as undoped polysilicon. In other embodiments, the semiconductor gate material of the second replacement gate structure 70 may include, but not limited to Si, strained Si, SiC, SiGe, SiCieC, Si alloys, Ge, Ge alloys, GaAs, InAs, and InP, as well as other III/V and II/VI compound, and combinations thereof. The semiconductor gate material of the second replacement gate structure 70 may be formed within the gate opening using a deposition process, including, e.g., chemical vapor deposition (CVD), plasma enhanced chemical vapor deposition (PECVD), physical vapor deposition (PVD), sputtering, atomic layer deposition (ALD) and other like deposition processes. The second replacement gate structure 70 is formed in the gate opening, wherein the gate opening is formed using the first replacement gate structure 60. Therefore, the geometry and dimensions of the replacement second gate structure 70 are the same as the geometry and dimensions of the first replacement gate structure 60. In some embodiments, following deposition, the upper surface of the semiconductor gate material may be planarized, e.g., planarized by chemical mechanical planarization, so that the upper surface of the second replacement gate structure 70 is coplanar with the upper surface of the semiconductor source and drain replacement material 65.

FIG. 8 depicts one embodiment of removing the semiconductor source and drain replacement material 65, and applying a surface treatment process to at least the sidewall surfaces of the second gate replacement structure 70 to convert a portion of the semiconductor gate material to a dielectric spacer material 75 on at least the sidewall surfaces of the second replacement gate structure 70. Typically, the dielectric spacer material 75 is also formed on the upper surface of the second replacement gate structure 70.

In one embodiment, the semiconductor source and drain replacement material 65 may be removed by an etch process that is selective to at least one of the dielectric coating 54, the suspended nanowires 10 and the second replacement gate structure 70. The etch process may include at leas one of an anisotropic etch or an isotropic etch. For example, the etch process may include reactive ion etching, plasma etching, wet chemical etching, and a combination thereof. Following removal of the semiconductor source and drain replacement material 65 the sidewall surfaces and upper surfaces, i.e., exterior surfaces, of the second replacement gate structure 70 are exposed.

The surface treatment for forming the dielectric spacer material 75 may include at least one of nitridation, implantation, annealing, plasma treatments and a combination thereof that is applied to the exterior surfaces of the second replacement gate structure 70. In some embodiments, the portion of the dielectric coating 54 that is present on the source and drain region portions of the suspended nanowires 10 protects the nanowires from being impacted by the surface treatment process for forming the dielectric spacer material 75.

In one embodiment, the dielectric spacer material 75 is formed into the sidewalls of the second replacement gate structure 70 by thermal nitridation. In thermal nitridation, the exterior surfaces of the semiconductor gate material that provides the second replacement gate structure 70 are exposed to a nitrogen containing atmosphere at an elevated temperature (greater than 25° C.). For example, the temperature of the thermal nitridation process may range from room temperature, e.g., 20-25° C., to 1200° C. In another example, the temperature of the thermal nitridation process ranges from 500° C. to 800° C. In some embodiments, when the semiconductor gate material of the second replacement gate structure 70 is a silicon containing material, such as polysilicon, the dielectric spacer material 75 formed by the surface treatment is silicon nitride. Typically, the nitrogen from the nitrogen containing atmosphere of the surface treatment diffuses into the exterior sidewalls of the semiconductor gate material of the second replacement gate structure 70. In one embodiment, the thickness T1 of the dielectric spacer material 75 formed by thermal nitridation may range from 2 nm to 30 nm. In another embodiment, the thickness T1 of the dielectric spacer material 75 formed by thermal nitridation may range from 5 nm to 20 nm. In some embodiments, the nitrogen concentration is typically greatest at the outermost perimeter of the silicon nitride dielectric spacer material 75 that is provided by the exterior surface of the semiconductor gate material that is converted to a dielectric, wherein the nitrogen concentration of the silicon nitride dielectric spacer 75 decreases in a direction towards the interior perimeter of the silicon nitride dielectric spacer material 75 that is more proximate to the center portion of the second replacement gate structure 70, hence providing a graded composition for the dielectric spacer material 75. Oxygen may also be introduced to the thermal nitridation process, hence providing a silicon oxynitride dielectric spacer material 75.

In another embodiment, the dielectric spacer material 75 is formed by thermal oxidation. In thermal oxidation, the exterior surfaces of the semiconductor gate material that provides the second replacement gate structure 70 are exposed to an oxygen containing atmosphere at an elevated temperature greater than 25° C.). For example, the temperature of the thermal oxidation process may range from room temperature, e.g., 20-25° C., (for plasma oxidation) to 1200° C. In another embodiment, the temperature of the thermal oxidation process may range from 500° C. to 800° C. In some embodiments, when the semiconductor gate material of the second replacement gate structure 70 is a silicon containing material, such as polysilicon, the dielectric spacer material 75 formed by the surface treatment is silicon oxide. Typically, the oxygen from the oxygen containing atmosphere of the surface treatment diffuses into the exterior sidewalls of the semiconductor gate material of the second replacement gate structure 70. In one embodiment, the thickness T1 of the dielectric spacer material 75 formed by thermal oxidation may range from 2 nm to 30 nm. In another embodiment, the thickness T1 of the dielectric spacer material 75 formed by thermal oxidation may range from 5 nm to 20 nm. In some embodiments, the oxygen concentration is typically greatest at the outermost perimeter of the silicon oxygen dielectric spacer material 75 that is provided by the exterior surface of the semiconductor gate material that is converted to a dielectric, wherein the oxygen concentration of the silicon nitride dielectric spacer 75 decreases in a direction towards the interior perimeter of the silicon oxygen dielectric spacer material 75 that is more proximate to the center portion of the second replacement gate structure 70, hence providing a graded composition for the dielectric spacer material 75. Nitrogen may also be introduced to the thermal oxidation process, hence providing a silicon oxynitride dielectric spacer material 75.

In another embodiment, the surface treatment for forming the dielectric spacer material 75 is provided by a plasma treatment to interdiffuse elements from the plasma into the semiconductor gate material of the second replacement gate structure 70. The plasma treatment is applied to the exterior surfaces of the semiconductor gate material of the second replacement gate structure 70, and may provide a dielectric spacer material 75 having a graded composition similar to the dielectric spacer material 75 provided by thermal oxidation and/or nitridation.

In yet another embodiment, the surface treatment for forming the dielectric spacer material 75 is provided by implantation, such as ion implantation or gas phase doping, of a dielectric species, such as oxygen or nitrogen. The implantation methods introduce the dielectric elements into the semiconductor gate material of the second replacement gate structure 70 to form the dielectric spacer material 75 through the exterior surfaces of the semiconductor gate material. Similar to the thermal oxidation, thermal nitridation, and plasma treatments described above for the surface treatment, the implantation of dielectric elements into the semiconductor gate material of the second replacement gate structure 70 can provide a dielectric spacer material 75 having a graded composition.

It is noted that the above provided surface treatments for forming the dielectric spacer material 75 are provided for illustrative purposes only and are not intended to be limited.

Figure 9:
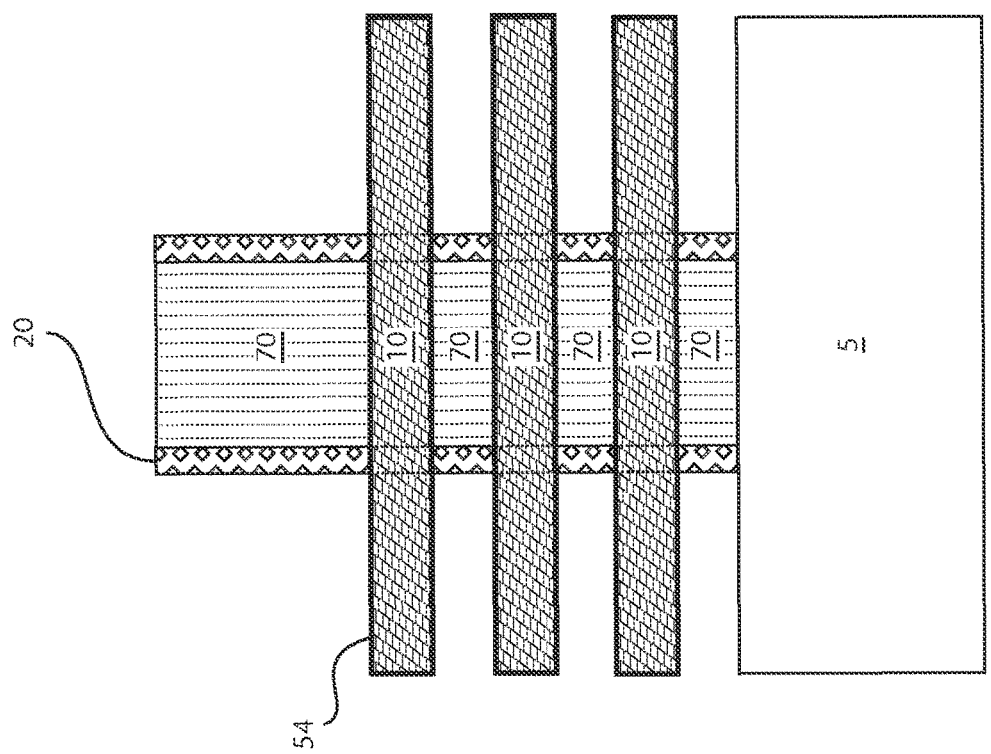
FIG. 9 is a side cross-sectional view depicting removing the portion of the dielectric spacer material from the upper surface of the second replacement gate structure to provide a dielectric spacer, in accordance with one embodiment of the present disclosure.

FIG. 9 depicts one embodiment of removing the portion of the dielectric spacer material 75 from the upper surface of the second replacement gate structure 70. The portions of the dielectric spacer 75 that are present on the sidewalls of the second replacement gate structure 70 remain to provide the dielectric spacers 20. Removing the portion of the dielectric spacer material 75 from the upper surface of the second replacement gate structure 70 may be provided by a planarization process, such as chemical mechanical planarization (CMP).

In some embodiments, because the first replacement gate structure 60 is highly symmetrical, and dictates the geometry of the second replacement gate structure 70, the second replacement gate structure 70 has a uniform gate length extending from an upper surface of the second replacement gate structure 70 to the base of the second replacement gate structure 70. The surface treatment for forming the dielectric spacer material 75 is uniformly applied to the exterior surfaces of the second replacement gate structure 70. Therefore, the dielectric spacer 20 that is present on the sidewalls of the second replacement gate structure 70 is highly symmetrical. More specifically, in some embodiments, the dielectric spacer 20 will have a uniform length extending from an upper surface of the dielectric spacer 20 to the base of the dielectric spacer 20.

Figure 10:
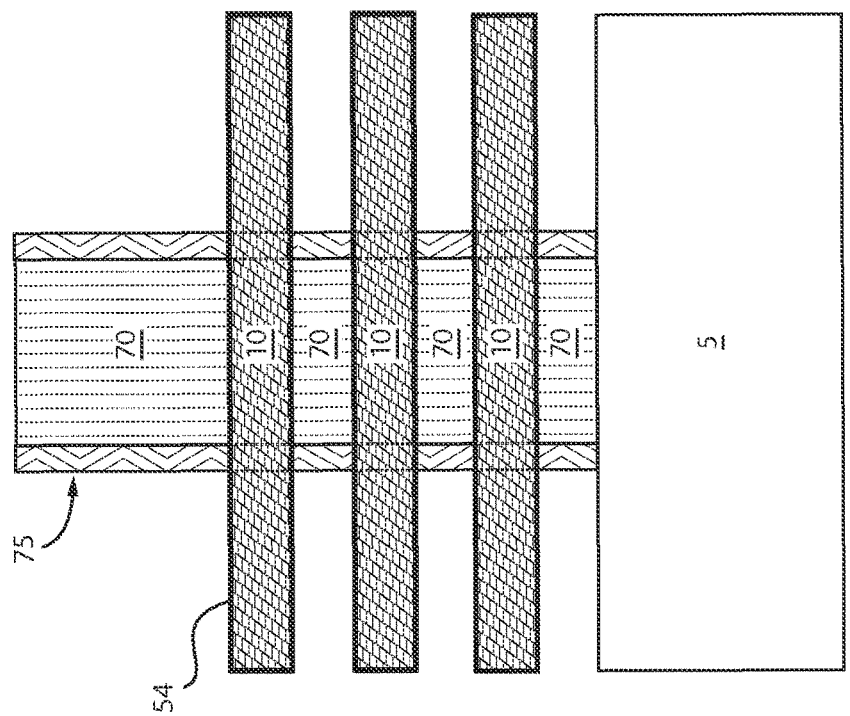
FIG. 10 is a side cross-sectional view of removing a dielectric coating from the source and drain region portions of the suspended nanowires, in accordance with one embodiment of the present disclosure.

FIG. 10 depicts one embodiment of removing a dielectric coating 54 from the source and drain region portions of the suspended nanowires 10. The exposed portions of the dielectric coating 54 may be removed by an etch that is selective to the suspended nanowires 10, the second replacement gate structure 70, the dielectric spacer 20 and the substrate 5.

Figure 11:
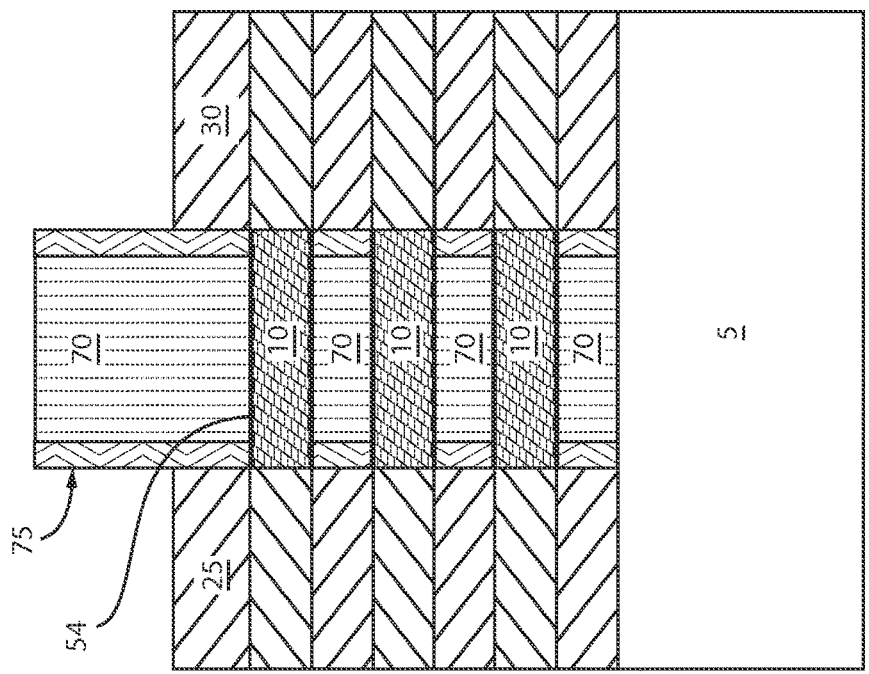
FIG. 11 is a side cross-sectional view of forming an epitaxial source and drain region semiconductor material on the source and drain region portions of the suspended nanowires, in accordance with one embodiment of the present disclosure.

FIG. 11 depicts one embodiment of forming an epitaxial source and drain region semiconductor material on the source and drain region portions of the suspended nanowires 10 to provide the source and drain regions 25, 30 of the semiconductor device. The epitaxial material that is present on the source and drain region portions of the suspended nanowires 10 may be formed using an epitaxial deposition process, "Epitaxial growth and/or deposition" means the growth of a semiconductor material on a deposition surface of a semiconductor material, in which the semiconductor material being grown has substantially the same crystalline characteristics as the semiconductor material of the deposition surface. An epitaxial material is a material that has been deposited using an epitaxial deposition process, and therefore has the characteristics of an epitaxially deposited material, such as having the substantially the same crystalline characteristics as the semiconductor material of the deposition surface. In some embodiments, when the chemical reactants are controlled and the system parameters set correctly, the depositing atoms of an epitaxial deposition process arrive at the deposition surface with sufficient energy to move around on the surface and orient themselves to the crystal arrangement of the atoms of the deposition surface. For example, an epitaxial film deposited on a {100} crystal surface will take on a {100} orientation. The epitaxially formed material may be formed on the deposition surface while present within the deposition chamber of a chemical vapor deposition (CVD) chamber, or the deposition chamber of a plasma enhanced chemical vapor deposition (PECVD) chamber.

The epitaxial material for the source and drain regions 25, 30 may be composed of silicon containing semiconductors, e.g., silicon and silicon doped with carbon; germanium containing semiconductors, e.g., germanium, silicon germanium, and silicon germanium doped with carbon; compound semiconductors, such as III-V semiconductor materials; and combinations thereof. A number of different sources may be used for the epitaxial deposition of the semiconductor material formed on the source and drain region portions of the suspended nanowires 10. In some embodiments, in which the epitaxial material is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2SiH_4$), hexamethyldisilane ($(Cl_3)_6Si_2$) and combinations thereof. In some embodiments, in which the epitaxial material is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the epitaxial material is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. It is noted that the above examples of gas sources are provided for illustrative purposes only, and are not intended to limit the present disclosure.

The thickness of the epitaxially deposited material is selected so that the space between adjacent suspended nanowires 10 is filled with epitaxial semiconductor material. Similar to the gate structure, the epitaxially deposited material is formed all around the entire perimeter of the suspended nanowires 10.

The epitaxial material is doped to provide the conductivity of the source and drain regions 25, 30. For example, the epitaxial material may be doped with an n-type or p-type dopant. The n-type or p-type dopant may be introduced to the epitaxial material using in situ doping techniques or ion implantation. In situ doping involves introducing the dopant to the epitaxially deposited material as it is being formed.

The dopant, e.g., n-type or p-type dopant, from the epitaxial material may be diffused into the source and drain region portions of the suspended nanowires 10 to provide a source and drain extension region. A portion of the source and drain extension region may extend beneath the dielectric spacer 20. Because of the uniformity of the dielectric spacer 20, the source and drain extension regions extend uniformly under a portion of the dielectric spacer 20 for each of the suspended nanowires 10.

Figure 12:
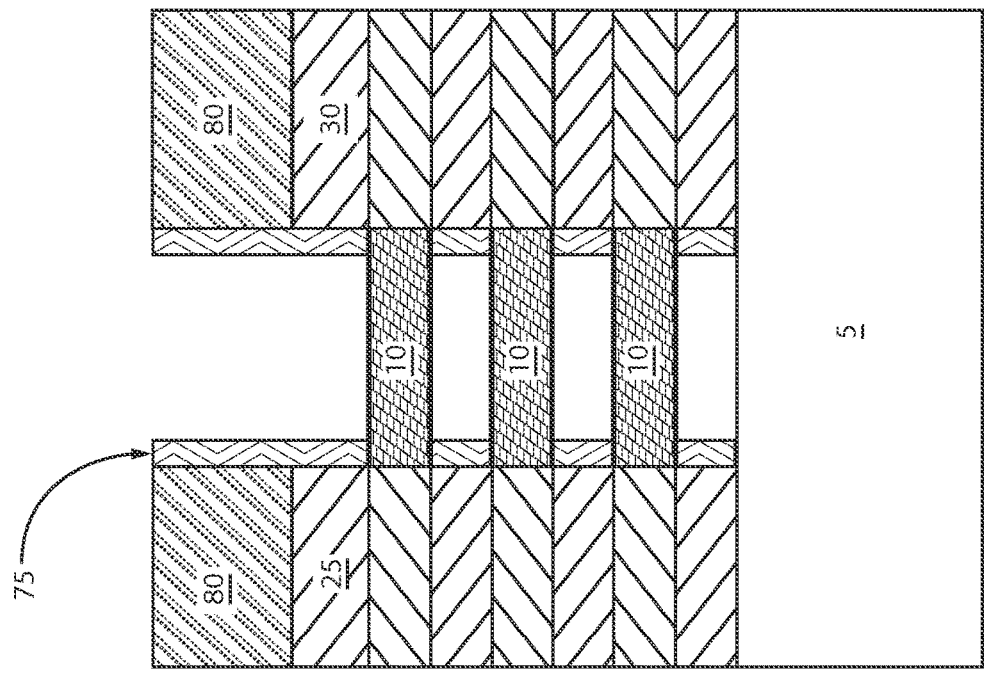
FIG. 12 is a side cross-sectional view depicting removing the second replacement gate structure, in accordance with one embodiment of the present disclosure.

FIG. 12 depicts one embodiment of removing the second replacement gate structure 70. In some embodiments, removing the second replacement gate structure 70 may begin with forming an organic dielectric layer 80 on an upper surface of the epitaxial material of the source and drain regions 25, 30, and planarizing the organic dielectric layer 80 until contacting the upper surface of the second replacement gate structure 70 so that an upper surface of the second replacement gate structure 70 and an upper surface of the organic dielectric layer 80 are coplanar.

The second replacement gate structure 70 may be removed using an etch process that is selective to at least the organic dielectric layer 80. The selective etch process may be a wet or dry etch process. In one embodiment, the second replacement gate structure 70 is removed by reactive ion etch (RIE). When composed of polysilicon, the second replacement gate structure 70 may be removed using etch chemistries, such as HBr, $SF_6$, and $NH_4OH$.

Figure 13:
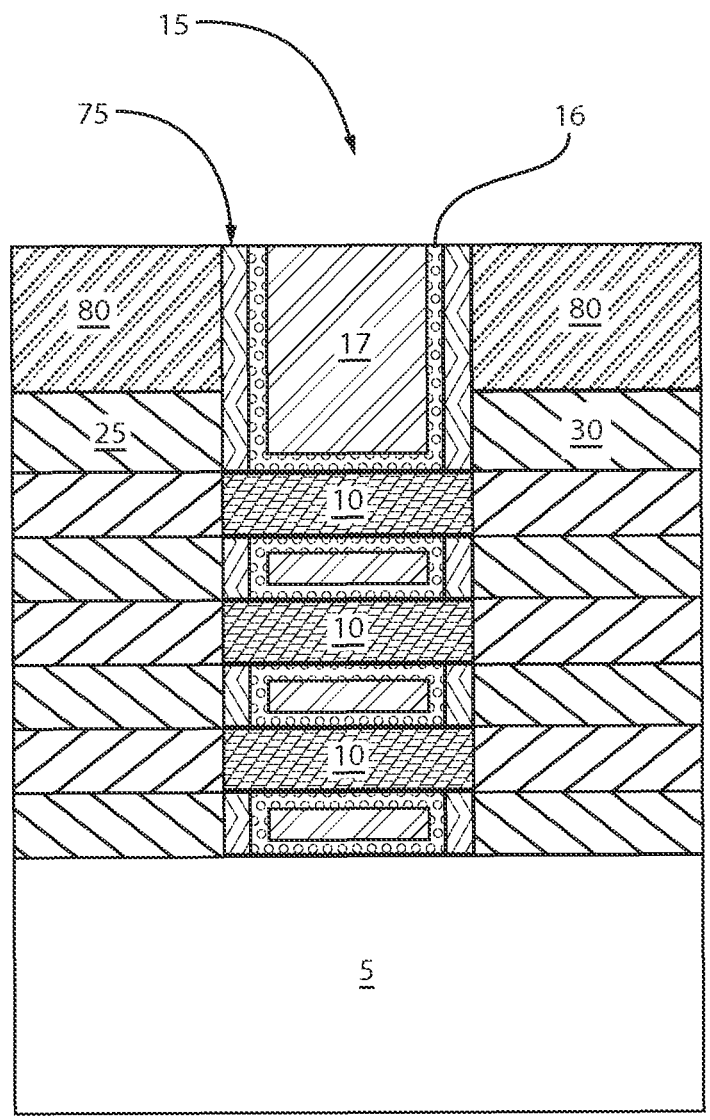
FIG. 13 is a side cross-sectional view depicting forming a functional gate structure in the opening to the channel region portion of the stack of suspended nanowires.

FIG. 13 depicts forming a functional gate structure 15 in the opening formed by removing the second replacement gate structure 70 to the channel region portion of the stack of suspended nanowires 10. The "functional gate structure" operates to switch the semiconductor device from an "on" to "off" state, and vice versa. The composition and geometry of the functional gate structure 15 including the at least one gate dielectric 16 and the at least one gate conductor have been described above with reference to FIGS. 1A and 1B.

Referring to FIG. 13, the at least one gate dielectric 16 may be formed using a deposition process, such as chemical vapor deposition (CVD). Examples of CVD processes for forming the at least one gate dielectric 16 include chemical vapor deposition (CVD), plasma enhanced chemical vapor deposition (PECVD), physical vapor deposition (PVD), atomic layer deposition (ALD) and other like deposition processes. The at least one gate dielectric 16 may also include material layers formed using a thermal growth process, such as thermal oxidation. The at least one gate conductor 17 may be formed on the at least one gate dielectric 16. The at least one gate conductor 17 may be formed using a deposition process. For example, when the at least one gate conductor 17 is composed of a semiconductor material, the at least one gate conductor 17 may be formed using may be formed using a deposition process, such as chemical vapor deposition (CVD). Examples of CVD processes for forming the at least one gate conductor 17 include chemical vapor deposition (CVD), plasma enhanced chemical vapor deposition (PECVD), atomic layer deposition (ALD) and other like deposition processes. In another embodiment, when the at least one gate conductor 17 is composed of a metal, the at least one gate conductor 17 is formed using a physical vapor deposition (PVD) process, such as sputtering. Examples of sputtering apparatus that may be suitable for depositing the at least one gate conductor 17 include DC diode type systems, radio frequency (RF) sputtering, magnetron sputtering, and ionized metal plasma (IMP) sputtering.

Following the formation of the functional gate structure 15, the organic dielectric layer 80 may be replaced with an interlevel dielectric layer 35, and contacts 40 may be formed to the functional gate structure 15, the source region 25 and the drain region 30. The interlevel dielectric layer 35 may be composed of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). It is noted that the above compositions for the interlevel dielectric layer 35 are provided for illustrative purposes only, and are not intended to limit the present disclosure. The interlevel dielectric layer 35 may be deposited using a deposition process, such as chemical vapor deposition (CVD), plasma enhanced chemical vapor deposition (PECVD), physical vapor deposition (PVD), spin on deposition and other like deposition processes. The interlevel dielectric layer 35 may be planarized using chemical mechanical planarization (CMP). To form the contacts 40, the interlevel dielectric material 35 may be patterned and etched to form via holes to the various source/drain and gate conductor regions of the device. Following via formation, the contacts 40 are formed by depositing a conductive metal into the via holes using deposition methods, such as CVD or plating. The conductive metal may include, but is not limited to: tungsten, copper, aluminum, silver, gold and alloys thereof.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but within the scope of the appended claims.

What is claimed is:

1. A semiconductor device comprising:
 a plurality of suspended nanowires;
 a gate structure present on a channel region portion of the plurality of suspended nanowires, the gate structure having a uniform length extending from an upper surface of the gate structure to the base of the gate structure;
 a dielectric spacer having a graded composition in direct contact with the gate structure, the dielectric spacer being composed of single material layer having a uniform length extending from an upper surface of the gate structure to the base of the gate structure, the graded composition defined by a decreasing oxygen or nitrogen concentration in a direction extending from an exterior surface of the dielectric spacer in a direction towards a center of the gate structure that the dielectric spacer is abutting; and
 source and drain regions present on source and drain region portions of the plurality of suspended nanowires.

2. The semiconductor device of claim 1, wherein the dielectric spacer is comprised of silicon nitride, silicon oxide, silicon germanium oxide, germanium oxide, germanium nitride, germanium oxygen nitride and combinations thereof.

3. The semiconductor device of claim 1, wherein the dielectric spacer is comprised of silicon and oxygen and the grading of the oxygen atoms in the dielectric spacer provides that within a 10 nm distance, the composition of the dielectric spacer changes from $SiO_2$ to SiO in a direction towards a center of the gate structure, or wherein the dielectric spacer is comprised of silicon and nitrogen and the grading of the nitrogen in the dielectric spacer provides that within a 10 nm distance, the composition of the dielectric spacer changes from a silicon to nitrogen ratio of 1:1 to a silicon to nitrogen ratio of 3:4 in a direction towards a center of the gate structure.

4. The semiconductor device of claim 1, wherein a length of the dielectric spacer ranges from 2 nm to 30 nm.

5. The semiconductor device of claim 1, wherein the gate structure is present completely around a perimeter of each nanowire in said plurality of nanowires.

6. The semiconductor device of claim 1, wherein the uniform length of the gate structure denotes a base dimension that is less than +/−1 nm different from an upper surface dimension, wherein said each sidewall of the gate structure intersects with the upper surface of the substrate at a right angle +/−5°.

7. The semiconductor device of claim 1, wherein the uniform length of the dielectric spacer denotes a base dimension that is less than +11 nm different from the upper surface dimension.

8. The semiconductor device of claim 1, wherein said each sidewall of the gate structure intersects with an upper surface of the suspended nanowire at a right angle +/−5°.

9. The semiconductor device of claim 1, wherein the plurality of suspended nanowires are composed of a silicon containing material.

* * * * *